(12) United States Patent
Marion et al.

(10) Patent No.: US 8,329,311 B2
(45) Date of Patent: Dec. 11, 2012

(54) NANOPRINTED DEVICE COMPRISING METALLIC PATTERNS AND METHOD OF NANOPRINTING METALLIC PATTERNS

(75) Inventors: François Marion, St Martin le Vinoux (FR); Cécile Davoine, Le Havre (FR)

(73) Assignee: Commissariat a l'Energie Atomique, Paris (FR)

( * ) Notice: Subject to any disclaimer, the term of this patent is extended or adjusted under 35 U.S.C. 154(b) by 1230 days.

(21) Appl. No.: 11/661,047

(22) PCT Filed: Sep. 25, 2005

(86) PCT No.: PCT/FR2005/050794
§ 371 (c)(1),
(2), (4) Date: Jan. 14, 2008

(87) PCT Pub. No.: WO2006/054004
PCT Pub. Date: May 26, 2006

(65) Prior Publication Data
US 2008/0107877 A1    May 8, 2008

(30) Foreign Application Priority Data
Oct. 4, 2004  (FR) ...................... 04 52250

(51) Int. Cl.
*B23K 35/02* (2006.01)
*B32B 15/01* (2006.01)

(52) U.S. Cl. ....... 428/576; 428/595; 428/599; 428/616; 428/617; 428/646; 428/672; 174/257; 257/737; 257/763; 257/781

(58) Field of Classification Search .......... 257/779–781, 257/737, 763; 428/576, 616, 617, 645, 646, 428/595, 599, 672; 174/257
See application file for complete search history.

(56) References Cited

U.S. PATENT DOCUMENTS

| | | | |
|---|---|---|---|
| 5,137,461 A * | 8/1992 | Bindra et al. ................... 439/74 |
| 5,259,926 A | 11/1993 | Kuwabara et al. ......... 156/659.1 |
| 5,772,905 A | 6/1998 | Chou .............................. 216/44 |
| 6,017,613 A * | 1/2000 | Baum et al. .................... 428/209 |
| 6,590,286 B2 * | 7/2003 | Okada et al. ................... 257/737 |
| 7,282,255 B2 * | 10/2007 | Hiranaka et al. ............... 428/209 |
| 7,509,733 B2 * | 3/2009 | Marion ........................... 29/846 |
| 7,717,718 B2 * | 5/2010 | Davoine et al. ................. 439/74 |
| 7,883,764 B2 * | 2/2011 | Murao ............................ 428/209 |

FOREIGN PATENT DOCUMENTS

| | | |
|---|---|---|
| JP | 2004319762 | 11/2004 |
| WO | 99/64642 | 12/1999 |
| WO | 2004/114017 A1 | 12/2004 |

OTHER PUBLICATIONS

French Search Report, PCT/FR2005/050794 (Feb. 10, 2005) pp. 6.
Chou, Stephen Y. et al., "Imprint Lithography With 25-Nanometer Resolution", Science, American Association for the Advancement of Science, US, vol. 272, (Apr. 5, 1996), pags. 85-87, XP000602257, ISSN: 0036-8075.

* cited by examiner

*Primary Examiner* — Cathy Lam
(74) *Attorney, Agent, or Firm* — Nixon Peabody LLP

(57) ABSTRACT

The invention concerns a nanoprinted device comprising point shaped metallic patterns, in which each metallic pattern has a bilayer structure controlled in hardness and in chemical properties comprising a lower layer (30) constituting the base of the point and an upper layer (31) constituting the point itself.

10 Claims, 3 Drawing Sheets

NANOPRINTED DEVICE COMPRISING METALLIC PATTERNS AND METHOD OF NANOPRINTING METALLIC PATTERNS

CROSS REFERENCE TO RELATED APPLICATIONS OR PRIORITY CLAIM

This application is a national phase of International Application No. PCT/FR2005/050794 entitled "Device Obtained By Nanoprinting Comprising Metallic Patterns And Method For Nanoprinting Of Metallic Patterns", which was filed on Sep. 29, 2005, which was not published in English, and which claims priority of the French Patent Application No. 04 52250 filed Oct. 04, 2004.

TECHNICAL FIELD

The invention concerns a nanoprinted device comprising metallic patterns and a method of nanoprinting metallic patterns.

The technical field to which the invention relates is that of microelectronics and more specifically the manufacture of nanostructures in metal or metal alloys.

The invention may be applied to all sorts of devices requiring the manufacture of metallic patterns of very small pitch, for example intermediate layers of nanopoints enabling the interconnection of several electronic components of reduced pitch.

STATE OF THE PRIOR ART

Nanoprinting is a technique enabling the manufacture of patterns of very reduced pitch, in other words patterns of several nanometres repeated at a pitch of several nanometres.

Nanoprinting on polymeric patterns enables the formation of masks. The document referenced [1] at the end of the description describes, for instance, a lithographic method for creating ultra-thin patterns (less than 25 nm) in a thin film deposited on a substrate, in which a mould having at least one projecting characteristic is pressed into this film. However, it is then difficult to form nanometallic patterns of sharp or complex shape, such as that which is necessary to pierce a layer of oxide as described in the document referenced [2]. This document describes, for instance, a method of connection by insertion between a first part equipped with hard conductive micro-points and a second part equipped with pads surmounted by ductile conductive micro-bumps, in which each micro-point must pierce the native oxide crust on the surface of a micro-bump. Indeed, techniques of etching and "lift off" reproduce flat patterns by nature of the photolithography techniques employed after nanoprinting of resins.

If one eliminates this step of nanoprinting of resins, one may then carry out a direct printing in the metal of point shaped patterns, or other complex shape, by means of a hard mould. This type of direct printing technique in the metal is described in the document referenced [3]. This document describes, for instance, nanoprinting of patterns in a substrate in aluminium by using a hard mould in SiC.

However, when one wishes to form such metallic patterns two problems can arise depending on the targeted applications:

1) Extreme nanoprinting pressures are necessary: the method proposed in the document referenced [3] necessitates the application of a very high moulding pressure: 2.38 T per $cm^2$. Said method cannot therefore be used on a thin metallic layer deposited on a fragile material, for example semi-conductor, without risk of bringing about a rupture.

2) The wire bonding pads must be cleared: in the case of an application of said method to a semiconductor wafer from a silicon foundry, it is necessary to clear the zones without metal around a chip comprising, as illustrated in FIG. 2B, a series of points 20 and wire bonding pads 23.

Moreover, after nanoprinting patterns on the desired surfaces it is necessary carry out an etching of the residues of printed material to remove them from the zones where they are not wanted.

In the case of a connection method by insertion, it involves printing points then eliminating the layer of residual metal crushed into a thin film in the wire bonding pad zones so as to enable access to these pads by the wire bonding wires. But these pads, which are usually in aluminium, then also risk being attacked.

FIG. 1A thus illustrates a moulding of metal under high pressure P. A mould 11 thereby makes it possible to obtain, on the surface of a substrate 12, a moulded metallic layer 13 forming a series of points 14, a residual metallic layer 15 remaining on the surface of this substrate.

FIG. 1B illustrates the etching 17 of the residual metal. This attack poses, therefore, the problem of the attack of the wire bonding pads 16 in aluminium.

FIGS. 2A and 2B illustrate one embodiment, in which one desires to print metallic points 20 in aluminium in a central zone 21 of chips covering a large wafer of CMOS circuit, and printing nothing in the exterior zone 22 having metallic pads in aluminium 23 enabling a subsequent wire bonding.

The etching of the residues of aluminium present between the points 20 after printing directly attacks the wire bonding pads 23 also in aluminium situated in the exterior zone 22, preventing their subsequent exploitation.

The invention has the effect of providing a solution to these problems of forming nano-metallic patterns.

DESCRIPTION OF THE INVENTION

The invention concerns a nanoprinted device comprising point shaped metallic patterns, characterised in that each metallic pattern has a metallic bilayer structure controlled in hardness and in chemical properties comprising a lower layer constituting the base of the point and an upper layer constituting the point itself.

Advantageously the material of the lower layer is a material with a melting temperature T1 greater than T2+200° C., T2 being the melting temperature of the upper layer, and a hardness greater than 10 GPa. The material of the upper layer is a metal with a melting point T2 similar to the printing temperature Tprint. One may thereby have the relation:

$$\tfrac{2}{3} \times T2 < T\text{print} > \tfrac{2}{3} \times T1.$$

Advantageously, the material of the upper layer may be chemically attacked by products that do not attack the material of the lower layer.

The invention further concerns a method of nanoprinting metallic patterns on the surface of a substrate, characterised in that it comprises the following steps:

- a step of deposition of a lower layer in metal on this substrate,
- a step of deposition of an upper layer in metal,
- a step of moulding of the upper layer,
- a step of etching of the upper layer stopping on the lower layer,
- a step of etching of the lower layer.

The step of moulding may be a step of indexing moulding, or a step of overall moulding. In both cases during the step of moulding:

one heats the substrate and the mould to a temperature such that: 186° C.<Tprint<1112° C., for an upper layer in AuSn, one applies a mould to the surface to be printed, one removes the mould.

Advantageously said method further comprises a step of etching after the step of deposition of the upper layer in metal.

The invention enables nanopatterns to be printed by direct printing in a metal with:

an application of a low printing pressure, an easy application of the etching of the residual metal.

The invention enables the manufacture of hybridized electronic components when it is associated with assembly techniques.

The invention may be used in particular:

in the manufacture of large size infrared detection matrices, of cold hybridized matrices of very small pitch, in the manufacture of cold hybridized components of all types (optical, X-ray, hybridization on flexible support, on ceramic, or multichip modules (MCM), in the treatment for the preparation for hybridization by printing without photolithography of components of very large size (for example to equip points of CMOS wafers of 300 mm, to prepare glass substrates for transferring circuits onto flat screens, to print wave guides in glass on a hard under-layer, etc.).

DETAILED DESCRIPTION OF SPECIFIC EMBODIMENTS

Figure 3:
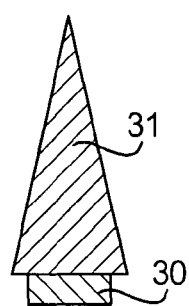
FIG. 3 illustrates a metallic pattern of the device of the invention.

As illustrated in FIG. 3, the structure of a metallic pattern of the nanoprinted device of the invention is a point shaped metallic bilayer structure controlled in hardness and in chemical properties comprising a lower layer 30 constituting the base of the point, and an upper layer 31 constituting the point itself.

The material of the lower layer 30 is a material with a melting temperature T1 greater than T2+200° C., T2 being the melting temperature of the upper layer, and a hardness greater than 10 GPa.

The material of the upper layer 31 is a metal with a melting point T2 similar to the printing temperature Tprint.

The two materials of these layers 30 and 31 satisfy a second criterion linked to the attack chemistries that are specific to them. The material of the upper layer 31 may be chemically attacked by products that do not attack the material of the lower layer 30.

Advantageously one may reduce the nanoprinting pressure by using a printing temperature Tprint greater than ⅔ of the melting temperature T2. The hardness of the metal is thus reduced and the necessary pressures also. One may thereby have the relation: ⅔×T2<Tprint<⅔×T1.

During nanoprinting, the metal of the lower layer 30, of great hardness to the printing pressure, protects the underlying fragile layers from any local pressures due to dust, asperities, etc. located between the press and substrate.

After nanoprinting one eliminates the problems of attack of the residues by choosing a pair of metals in such a way that there exists a selective attack chemistry of the upper layer compared to the lower layer. Initially, one therefore attacks the upper layer 31 stopping on the lower layer 30, the pads 36 present on the surface of the substrate 32 being protected by the lower layer. The attack of the metal of the lower layer 30 during a subsequent etching step enables the lower layer to be eliminated only in the non printed zones.

Example of Application of the Method of the Invention

Figure 1A:
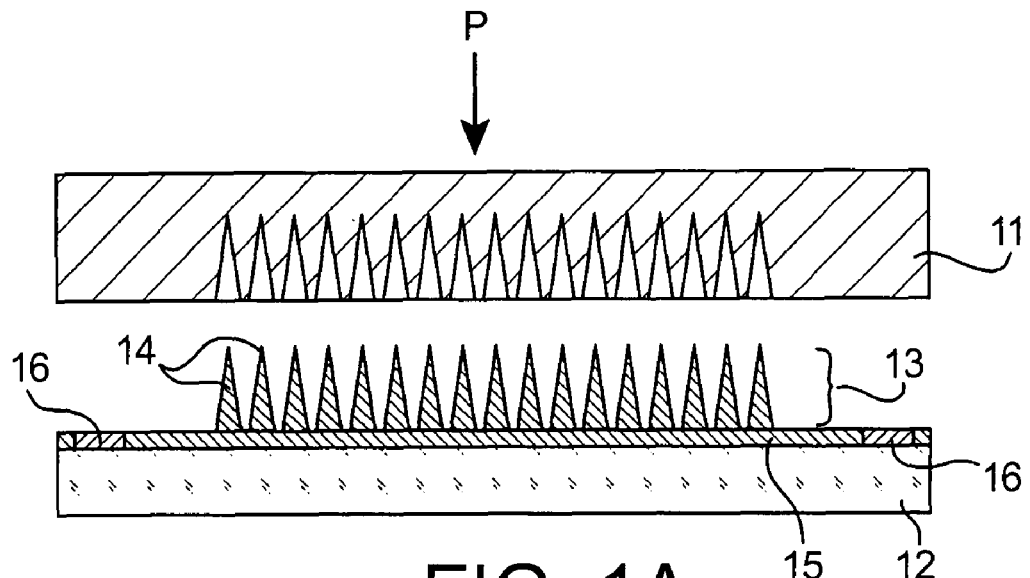
FIGS. 1A and 1B illustrate a method of the prior art.
Figure 1B:
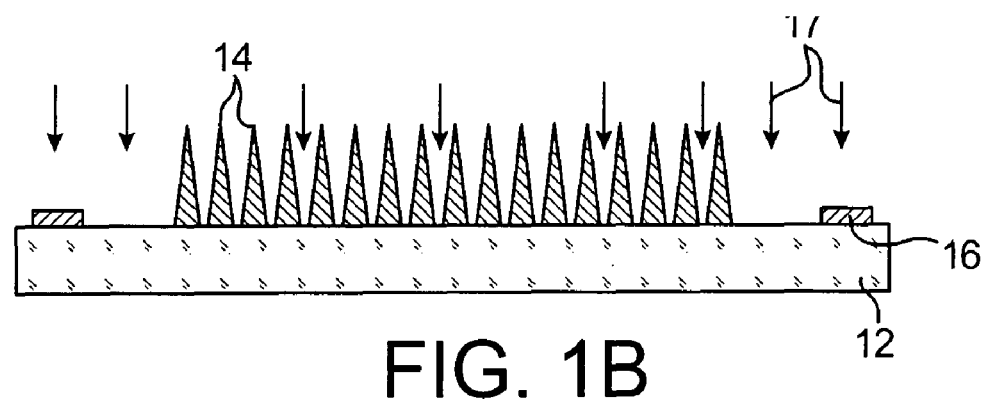
Figure 2A:
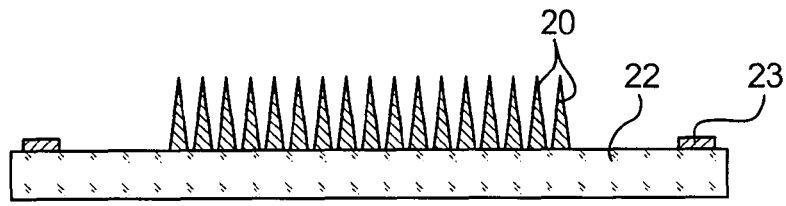
FIGS. 2A and 2B illustrate the manufacture of micropoints on a CMOS wafer, by using a method of the prior art.
Figure 2B:
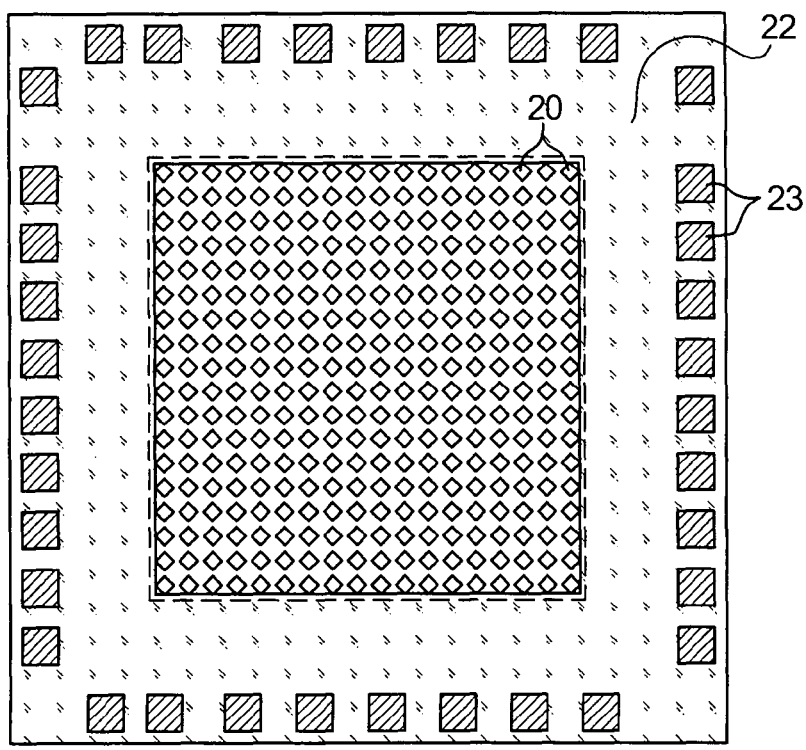
Figure 4A:
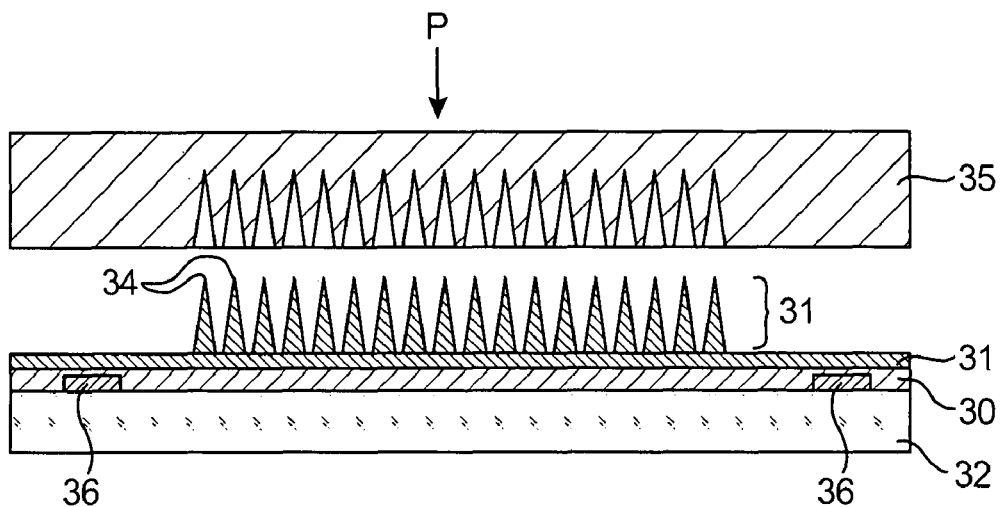
FIGS. 4A, 4B and 4C illustrate the steps of the method of the invention.
Figure 4B:
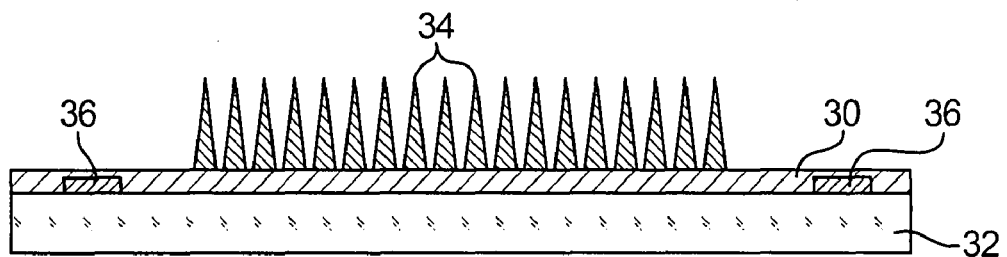
Figure 4C:
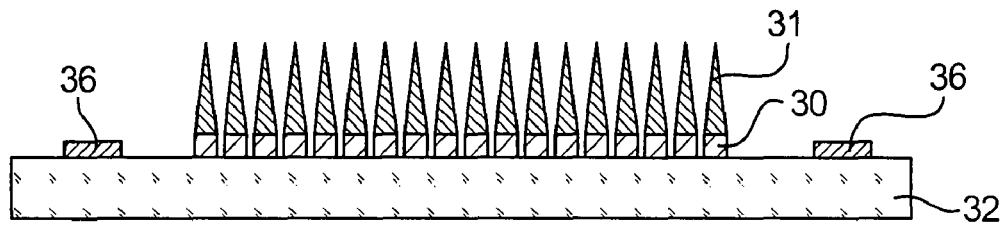

This example, illustrated by FIGS. 4A to 4C, is applied to a CMOS wafer from a silicon foundry, as illustrated in FIGS. 2A and 2B. It comprises the following steps:

1) Deposition of the Lower Layer 30

A deposition of Ti (T1=1667° C.), is carried out in a standard sputtering machine on the substrate 32 to be equipped with points, for example a CMOS substrate from a 300 mm foundry.

2) Deposition of the Upper Layer 31

A deposition of Au80Sn20 (4 μm) is carried out in a standard deposition machine (evaporation, sputtering, electrolysis, etc.). The melting temperature of this eutectic is 280° C.

3) Definition of the Upper Layer 31

This step is optional. It enables the removal of the residual layers to be separated.

During this step, a removal is carried out on the founder pads before printing and between the wire bonding pads nanoprinted after printing. This step largely facilitates the overall method. Indeed, if the material forming the points is formed uniquely in the zones where it is useful, it is no longer necessary to press it in the zones 22. Since the pressure is thereby only exercised in the zones 21, it is substantially reduced.

One may either perform a KI masking to carry out this etching, or deposit the material 31 by "lift off" method (selective deposition of resin before the deposition of the material). One carries out a masking at low cost (no resolution required on large squares) and one etches the upper layer 31 in the zone 22 illustrated in FIG. 2B, stopping on the lower layer 30. In both cases, the material 30 is deposited as a continuous base on the wafer to assure its role of protection.

4) Moulding of the Upper Layer 31

The operation of moulding this layer 31 is carried out in accordance with:

either a technique of moulding by "indexing" (a mould 35 of the size of a photocomposition field is applied to each field and indexed at the pitch of the field ("step and repeat"))

or a technique of "overall" moulding, where the mould 35 is the same size as the wafer (300 mm) and the moulding is performed in a single operation.

In both cases:

One heats the substrate 32 and the mould 35 to a temperature: ⅔×T2<Tprint<⅔×T1 i.e. 186° C.<Tprint<1112° C., for an upper layer in AuSn, One applies the mould 35 to the surface to be printed with a pressure P. The points are printed in a traditional manner. The lower layer 30 protects the surface of the substrate 32 and is not deformed, One removes the mould 35.

5) Etching of the Residual Upper Layer

At the end of the previous step there remains, between the points, a residual upper layer 31 on the unaltered lower layer 30. If the printed patterns have, for example, a final height of 6 μm and the residual layer has a thickness of 0.2 μm, one carries out a uniform etching corresponding for example to a removal of 0.3 μm of upper layer over its entire surface by chemical means. The chemistry used, being selective, automatically stops on the lower layer.

The residual upper layer is thus cleared between the points 31. This step is not critical due to the fact that the lower layer 30 then forms a barrier layer.

The zone 22 is exposed to this etching, and the wire bonding pads 36 are protected by the lower layer 30. Due to this overall etching, the point uniformly loses a thickness of 0.3 μm over its whole exterior envelope. The dimensions of the mould 35 therefore take this loss into account.

6) Etching of the Lower Layer 30

The metal of the lower layer 30 is etched by a specific selective chemistry: for example a chemistry based on H2O2 (lower layer in titanium) or a fluorinated plasma.

The lower layer is etched simultaneously in the zones 21 and 22.

The final points 34 may be for example points 6 μm high, of diameter at the base of 1 μm, repeated at a pitch of 2 μm. For the upper layer 31 one generally uses binaries of low melting point but pure metals can also be suitable, as can any ternary (or+) alloy. A nanoprinting of glass may also be envisaged.

One may thereby have the following table:

| Upper layer | Melting temperature (° C.) | Chemistry | Suggested thickness |
|---|---|---|---|
| Au80Sn20 | 280 | Based on KI | 1 20 μm |
| Au97Si3 | 363 | KI– | — |
| Au88Ge12 | 361 | KI– | — |
| Sn5Pb95 | 315 | Based on HCl, HNO3 acid | — |
| Sn62Pb38 | 183 | — | — |
| Sn | 232 | — | — |
| AgCuSn | 210 | — | — |

| Lower layer | Melting point | Chemistry | Suggested thickness |
|---|---|---|---|
| Pd | 1554 | HNO3 | 0.1-2 μm |
| Pt | 1768 | Hot HCl | — |
| Ni | 1455 | FeCl3 | — |
| Ti | 1667 | H2O2 | — |
| TiW, TiN, etc. | >1200 | H2O2 | — |
| Cr | 1860 | Perchloric or nitric base | — |

A thickness ratio of 10 to 1 is interesting between the upper layer and the lower layer. The printing pitch diminishes with the thicknesses.

REFERENCES

[1] U.S. Pat. No. 5,772,905
[2] U.S. Pat. No. 6,179,198
[3] Article entitled "Direct nano-printing on Al substrate using a SiC mold" of S. W. Pang, T. Tamamura, M. Nakao, A. Ozawa and H. Masuda (J. Vac. Sci. Technol, B 16(3), May/June 1998, pages 1145 and 1146).

The invention claimed is:

1. Nanoprinted device comprising nano-metallic patterns forming points disposed on a substrate, each point having a bilayer structure comprising a lower metal layer (30) constituting a base of the point and an upper metal layer (31) constituting the point itself, wherein the material of the lower metal layer has a melting temperature T1 greater than T2+200° C., T2 being the melting temperature of the upper metal layer, and with the lower layer having a hardness greater than 10 GPa so that during nanoprinting, in a first time, a chemical attack of the upper metal layer stops on the lower metal layer, the lower metal layer forming then a barrier layer.

2. Device according to claim 1, in which the melting point T2 of the upper metal layer is similar to a printing temperature Tprint.

3. Device according to claim 2 in which one has the relation:

$$\tfrac{2}{3} \times T2 < T\text{print} < \tfrac{2}{3} \times T1.$$

4. Device according to claim 1, in which the material of the upper metal layer (31) may be chemically attacked by products that do not attack the material of the lower metal layer (30).

5. Device according to claim 1, wherein there is a thickness ratio of upper metal layer to lower metal layer of each point equal to 10 to 1.

6. Device according to claim 1, wherein the substrate is a CMOS substrate.

7. Device according to claim 1, wherein each point is several μm high, of diameter of 1 μm, repeated at a pitch of a few μm.

8. Device according to claim 1, wherein the lower metal layer is Ti and the upper metal layer is Au80Sn20.

9. Nanoprinted device comprising nano-metallic patterns forming points disposed on a substrate, each point having a bilayer structure comprising a lower metal layer (30) constituting a base of the point and an upper metal layer (31) constituting the point itself, wherein the material of the upper metal layer may be chemically attacked by products that do not attack the material of the lower metal layer, wherein the lower metal layer is formed of Ti.

10. Nanoprinted device comprising nano-metallic patterns forming points disposed on a substrate, each point having a bilayer structure comprising a lower metal layer (30) constituting a base of the point and an upper metal layer (31) constituting the point itself, wherein the material of the upper metal layer may be chemically attacked by products that do not attack the material of the lower metal layer, wherein the upper metal layer is formed as Au80Sn20.

* * * * *